(12) United States Patent
Lee et al.

(10) Patent No.: US 7,928,429 B2
(45) Date of Patent: Apr. 19, 2011

(54) ORGANIC TFT, METHOD OF MANUFACTURING THE SAME AND FLAT PANEL DISPLAY DEVICE HAVING THE SAME

(75) Inventors: Hun-Jung Lee, Suwon-si (KR); Min-Chul Suh, Suwon-si (KR); Jae-Bon Koo, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1085 days.

(21) Appl. No.: 11/435,849

(22) Filed: May 18, 2006

(65) Prior Publication Data

US 2006/0270122 A1    Nov. 30, 2006

(30) Foreign Application Priority Data

May 27, 2005    (KR) .................. 10-2005-0045189

(51) Int. Cl.
*H01L 51/10*    (2006.01)
(52) U.S. Cl. ............... 257/40; 257/E51.006; 438/99
(58) Field of Classification Search .......... 257/40, 257/E51.001–E51.052, 59, 72; 438/99
See application file for complete search history.

(56) References Cited

U.S. PATENT DOCUMENTS

| 4,389,481 | A | * | 6/1983 | Poleshuk et al. | 438/160 |
| 5,191,397 | A | * | 3/1993 | Yoshida | 257/347 |
| 5,396,083 | A | * | 3/1995 | Kim et al. | 257/59 |
| 5,981,317 | A | * | 11/1999 | French et al. | 438/161 |
| 6,136,702 | A | * | 10/2000 | Chandross et al. | 438/678 |
| 6,391,691 | B1 | * | 5/2002 | Tsujimura et al. | 438/151 |
| 6,661,024 | B1 | * | 12/2003 | Zhang et al. | 257/40 |
| 6,716,686 | B1 | * | 4/2004 | Buynoski et al. | 438/157 |
| 6,787,405 | B2 | * | 9/2004 | Chen | 438/154 |
| 2003/0059975 | A1 | * | 3/2003 | Sirringhaus et al. | 438/99 |
| 2003/0059987 | A1 | | 3/2003 | Sirringhaus et al. | 438/149 |

(Continued)

FOREIGN PATENT DOCUMENTS

CN    1510974    7/2004

(Continued)

OTHER PUBLICATIONS

Sirringhaus, H., et al. "Integrated Optoelectronic Devices Based on Conjugated Polymers." Science, vol. 280 (1998): pp. 1741-1744.*

(Continued)

*Primary Examiner* — Matthew W Such
(74) *Attorney, Agent, or Firm* — Robert E. Bushnell, Esq.

(57) ABSTRACT

An organic thin film transistor (TFT), a method of making and a display including the organic TFT. In the TFT, the disconnection of a channel region does not occur because a step difference between a substrate and source and drain electrodes is lessened or eliminated by forming the source and drain electrodes in grooves in a buffer film. The method of manufacturing the organic TFT includes forming a buffer film on a substrate, forming concave units separated by a distance from each other in the buffer film by etching the buffer film, forming an electrode layer on the buffer film, forming source and drain electrodes within the concave units by etching the electrode layer using a photolithography process, forming a semiconductor layer on the source and drain electrodes and on the buffer film, forming a gate insulating film on the semiconductor layer and forming a gate electrode on the gate insulating film.

17 Claims, 4 Drawing Sheets

U.S. PATENT DOCUMENTS

| | | | |
|---|---|---|---|
| 2003/0160235 A1* | 8/2003 | Hirai | 257/40 |
| 2003/0230747 A1* | 12/2003 | Ostergard | 257/40 |
| 2004/0063267 A1* | 4/2004 | Bernds et al. | 438/202 |
| 2004/0140762 A1 | 7/2004 | Tohma et al. | |
| 2004/0169009 A1* | 9/2004 | Kitamura et al. | 216/67 |
| 2004/0178391 A1 | 9/2004 | Conaghan et al. | |
| 2004/0200061 A1 | 10/2004 | Coleman et al. | 29/825 |
| 2004/0224433 A1 | 11/2004 | Yamazaki et al. | |
| 2004/0266207 A1* | 12/2004 | Sirringhauss et al. | 438/725 |
| 2005/0029591 A1* | 2/2005 | Yudasaka et al. | 257/347 |
| 2005/0181533 A1* | 8/2005 | Kawase et al. | 438/82 |
| 2005/0211976 A1* | 9/2005 | Redecker et al. | 257/40 |
| 2005/0214983 A1 | 9/2005 | Maekawa | 438/149 |
| 2005/0247978 A1 | 11/2005 | Weng et al. | 257/347 |
| 2006/0030067 A1* | 2/2006 | Huang et al. | 438/99 |
| 2006/0046359 A1 | 3/2006 | Noda et al. | 438/149 |
| 2006/0079032 A1 | 4/2006 | Denda | 438/149 |
| 2006/0145146 A1* | 7/2006 | Suh et al. | 257/40 |
| 2006/0148167 A1* | 7/2006 | Brown et al. | 438/232 |
| 2006/0160276 A1* | 7/2006 | Brown et al. | 438/149 |
| 2006/0197079 A1* | 9/2006 | Suh et al. | 257/40 |
| 2008/0193793 A1* | 8/2008 | Johannes et al. | 428/690 |
| 2008/0277648 A1* | 11/2008 | Wakita | 257/40 |

FOREIGN PATENT DOCUMENTS

| | | |
|---|---|---|
| CN | 1535090 A | 10/2004 |
| CN | 1870235 B | 12/2010 |
| DK | 102 55 870 | 6/2004 |
| JP | 2001-118496 | 4/2001 |
| JP | 2001281680 A | 10/2001 |
| JP | 2002176178 A | 6/2002 |
| JP | 2002333846 A | 11/2002 |
| JP | 2003-92410 | 3/2003 |
| JP | 2003518332 | 6/2003 |
| JP | 2005108931 A | 4/2005 |
| KR | 2002-0084427 | 11/2002 |
| KR | 10-2004-0029402 | 4/2004 |
| KR | 2004-0028010 | 4/2004 |
| KR | 10-2004-0065175 | 7/2004 |
| WO | WO 03/080285 | 10/2003 |
| WO | WO 2004/004025 | 1/2004 |
| WO | WO 2004/055919 | 7/2004 |
| WO | WO 2004/055920 | 7/2004 |
| WO | WO 2005/022664 | 3/2005 |
| WO | WO 2005043639 A1 * | 5/2005 |
| WO | WO 2006/062826 | 6/2006 |

OTHER PUBLICATIONS

Chinese Office Action from Chinese Patent Office issued in Applicant's corresponding Chinese Patent Application No. 2006100996179 dated Jan. 9, 2009.

European Office Action of the European Patent Application No. 05 11 1732 (corresponding U.S. Appl. No. 11/296,874), issued on Apr. 12, 2006.

European Office Action of the European Patent Application No. 05 11 1732 (corresponding U.S. Appl. No. 11/296,874), issued on Jun. 9, 2006.

Korean Office Action of the Korean Patent Application No. 2004-103129 (corresponding U.S. Appl. No. 11/296,874), issued on Jul. 13, 2006.

Chinese Office Action of the Chinese Patent Application No. 200510138091.6. (corresponding U.S. Appl. No. 11/296,874), issued on Jul. 4, 2008 (with English translation).

Japanese Office Action of the Japanese Patent Application No. 2005-353685 (corresponding U.S. Appl. No. 11/296,874), issued on Aug. 5, 2008.

An article "High-Resolution Inkjet Printing of All-Polymer Transistor Circuits" written by Siminghaus, et al., published in Science, American Association for the Advancement of Science, vol. 290, pp. 2123-2126 on Dec. 15, 2000.

An article "Metallization of Solar cells with Ink Jet Printing and Silver Metallo-Organic Inks" written by Teng, et al., published in IEEE Transactions on Components, Hybrids, and Manufacturing Technology, vol. 11 No. 3, pp. 291-297 on Sep. 1, 1988.

"Nanotechnology", Wikipeida, the free encyclopedia, http://en.wikipedia.org/wiki/Nanotechnology.

Nanotechnology—Nanoscience glossary, Nanocompositech, http://www.nanocompositech.com/glossary-nanocomposite-nanotechnology.htm.

"Nanoparticles and Powders", http://www.ringsurf.com/online/2018-nanoparticles_and_powders.html.

"Risk Assessment of Nanoparticles", IOM, http://www.iom-world.org/research/nanoparticles.php.

"Nanotechnology solutions", Malvern.com, http://www.malvern.co.uk/LabEng/industry/nanotechnology/nanoparticle_definition.htm.

"What are Nanoparticles", An Introduction to Nanoprticles, http://www.chm.bris.ac.uk/webprojects2002/etan/Webpages/home2.htm.

Karn et al., "Nano particles Without Macroproblems", IEEE Spectrum Special Report, http://spectrum.ieee.org/Sep07/5487.

Japanese Office Action issued by the Japanese Patent Office on Apr. 23, 2010, corresponding to the Korean Priority Application No. 2005-0045189.

Japanese Office Action dated Aug. 17, 2010, No. 2006-141930 issued by the Japanese Patent Office, together with a Request for Entry.

* cited by examiner

ORGANIC TFT, METHOD OF MANUFACTURING THE SAME AND FLAT PANEL DISPLAY DEVICE HAVING THE SAME

CLAIM OF PRIORITY

This application makes reference to, incorporates the same herein, and claims all benefits accruing under 35 U.S.C. §119 from an application for OTFT AND FABRICATION METHOD THEREOF AND FLAT PANEL DISPLAY DEVICE WITH THE SAME earlier filed in the Korean Intellectual Property Office on 27 May 2005 and there duly assigned Serial No. 10-2005-0045189.

BACKGROUND OF THE INVENTION

1. Field of the Invention

The present invention relates to a flat panel display device that includes an organic thin film transistor (TFT) in which a pattern failure of an organic semiconductor layer in the organic TFT can be avoided by preventing a step difference between the source and the drain electrodes and the substrate, a method of manufacturing the organic TFT, and a flat panel display device having the organic TFT.

2. Description of the Related Art

Organic TFTs are considered to be next generation driving devices, and many studies of organic TFTs are being conducted. Organic TFTs use an organic film instead of a silicon film as a semiconductor layer, and the organic film can be formed via a printing process under atmospheric pressure instead of using a plasma enhanced chemical vapor deposition (PECVD) process, which is used for forming ordinary silicon thin films. An organic TFT can be manufactured in a roll to roll process using a plastic substrate at a low cost.

An organic TFT that uses an organic film as the semiconductor layer has drawn attention as a switching device for a flexible organic electroluminescent display device since organic TFTs can be manufactured at a low temperature. A pentacene TFT with high hole mobility and a method of manufacturing the pentacene TFT that reduces the time for depositing a thin film is disclosed in Korean Patent Publication No. 2004-0028010 The structure of an organic TFT with good electrical performance and a method of manufacturing the organic TFT are disclosed in Korean Patent Publication No. 2002-0084427. Also, a TFT with high carrier mobility and high on/off current ratio due to a channel region formed of an organic compound having a radical is disclosed in Japanese Patent Publication No. 2003-92410.

Organic TFTs are classified into low molecular organic TFTs with an organic film formed of a low molecular organic material, such as oligothiophene, pentacene, etc., and polymer organic TFTs with an organic film formed of a polymer organic material, such as a polythiophene group. Alsox, organic TFTs can be classified into top gate type TFTs, in which a gate is arranged on an organic semiconductor layer, and bottom gate type TFTs, in which the gate is arranged under the organic semiconductor layer.

An organic TFT includes source and drain electrodes formed on a substrate, an organic semiconductor layer formed on the source and drain electrodes, a gate insulating film formed on the organic semiconductor layer, and a gate electrode formed on the gate insulating film. After the source and drain electrodes are formed on the substrate, the organic semiconductor layer and the gate insulating film are formed by coating or deposition. Specifically, when the organic semiconductor layer is formed by coating, if the source and drain electrodes are formed as thick metal wires, the organic semiconductor layer must be coated to a thickness equal to or greater than the thickness of the metal wires. A portion of the organic semiconductor layer between the source and drain electrodes serves as a channel region. Therefore, if the organic semiconductor layer is too thick, the channel layer may not become properly conductive, or a high driving voltage must be applied to make the channel layer conductive.

Therefore, the organic semiconductor layer must be sufficiently thin so that the channel layer readily becomes conductive through the application of a predetermined driving voltage. When the organic semiconductor layer is thinner than the source and drain electrodes of metal wires, an edge portion of the source and drain electrodes can experience electrostatic discharge or can cause a pattern failure of a semiconductor layer due to poor step coverage, thus causing a disconnection of wires in the channel region. What is needed is an improved design for an organic TFT and a flat panel display using the organic TFT that overcomes these problems.

SUMMARY OF THE INVENTION

It is therefore an object of the present invention to provide an organic TFT in which a pattern failure of an organic semiconductor layer is avoided by reducing or eliminating a step difference between source and drain electrodes and a substrate.

It is also an object of the present invention to provide a method of manufacturing the organic TFT with little or no step coverage between the source/drain electrodes and the substrate.

It is further an object of the present invention to provide a flat panel display device having an organic TFT in which a step difference between source and drain electrodes and a substrate is reduced or eliminated.

These and other aspects can be achieved by a method of manufacturing thin film transistor including forming a buffer film on a substrate, forming concave units separated by a distance from each other in the buffer film by etching the buffer film, forming an electrode layer on the buffer film, forming source and drain electrodes within the concave units by etching the electrode layer using a photolithography process, forming a semiconductor layer on the source and drain electrodes and on the buffer film, forming a gate insulating film on the semiconductor layer and forming a gate electrode on the gate insulating film.

The substrate can be a glass substrate, a plastic substrate or a metal substrate. The buffer film can be an insulating film. The gate insulating film can have one or more layers, each layer of said one or more layers being either a silicon oxide film or a silicon nitride film. The semiconductor layer can include an organic semiconductor material.

According to another aspect of the present invention, there is provided a thin film transistor that includes a substrate, a buffer film arranged on the substrate and including a plurality of concave units, each of the plurality of concave units being separated from each other by a distance, source and drain electrodes arranged within the plurality of concave units in the buffer film, a semiconductor layer arranged on the source and drain electrodes and on the buffer film, a gate insulating film arranged on the semiconductor layer and a gate electrode arranged on the gate insulating film.

The substrate can be a glass substrate, a plastic substrate or a metal substrate. The buffer film can have one or more layers, each of said one or more layers being either a silicon oxide film or silicon nitride film. The semiconductor layer can be an organic semiconductor material. Each of the plurality of concave units are one of grooves and openings.

According to yet another aspect of the present invention, there is provided an organic electroluminescent display device that includes a substrate, a buffer film arranged on the substrate and including a plurality of concave units, each of said plurality of concave units being separated from each other by a distance, a thin film transistor arranged on the buffer film, the thin film transistor including source and drain electrodes arranged in the plurality of concave units in the buffer film, a semiconductor layer arranged over the source and drain electrodes and over the buffer film, a gate electrode and an insulating film arranged between the semiconductor layer and the gate electrode and an organic electroluminescent device arranged on the thin film transistor, the organic electroluminescent device including a lower electrode connected to one of the source and the drain electrodes, an organic film layer arranged on the lower electrode and an upper electrode arranged on the organic film layer.

The buffer film can be an inorganic insulating film. The buffer film can be one or more layers, each layer of the one or more layers being one of a silicon oxide film and a silicon nitride film. The substrate can be a glass substrate, a plastic substrate or a metal substrate. The semiconductor layer can include an organic semiconductor material. The concave units are either grooves or openings.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

The above and other features and advantages of the present invention will become more apparent by describing in detail exemplary embodiments thereof with reference to the attached drawings in which.

DETAILED DESCRIPTION OF THE INVENTION

Figure 1:
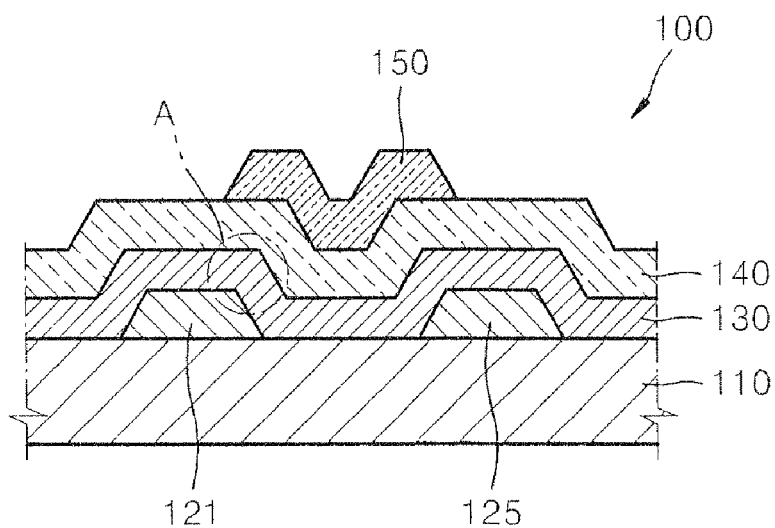
FIG. 1 is a cross-sectional view of an organic TFT.

Turning now to the figures, FIG. 1 is a cross-sectional view of a top gate type organic TFT 100. Referring to FIG. 1, the organic TFT 100 includes source and drain electrodes 121 and 125 formed on a substrate 110, an organic semiconductor layer 130 formed on the source and drain electrodes 121 and 125, a gate insulating film 140 formed on the organic semiconductor layer 130, and a gate electrode 150 formed on the gate insulating film 140.

After the source and drain electrodes 121 and 125 are formed on the substrate 110, the organic semiconductor layer 130 and the gate insulating film 140 are formed by coating or deposition. Specifically, when the organic semiconductor layer 130 is formed by coating, if the source and drain electrodes 121 and 125 are formed as thick metal wires, the organic semiconductor layer 130 must be coated to a thickness equal to or greater than the thickness of the metal wires.

A portion of the organic semiconductor layer 130 between the source and drain electrodes 121 and 125 serves as a channel region. Therefore, if the organic semiconductor layer 130 is too thick, the channel layer may not become properly conductive, or a high driving voltage must be applied to make the channel layer conductive.

Therefore, the organic semiconductor layer 130 must be sufficiently thin so that the channel layer readily becomes conductive through the application of a predetermined driving voltage. When the organic semiconductor layer 130 is thinner than the source and drain electrodes 121 and 125 of metal wires, an edge portion (portion A in FIG. 1) of the source and drain electrodes 121 and 125 can experience electrostatic discharge or can cause a pattern failure of a semiconductor layer due to poor step coverage, thus causing a disconnection of wires in the channel region.

Figure 2:
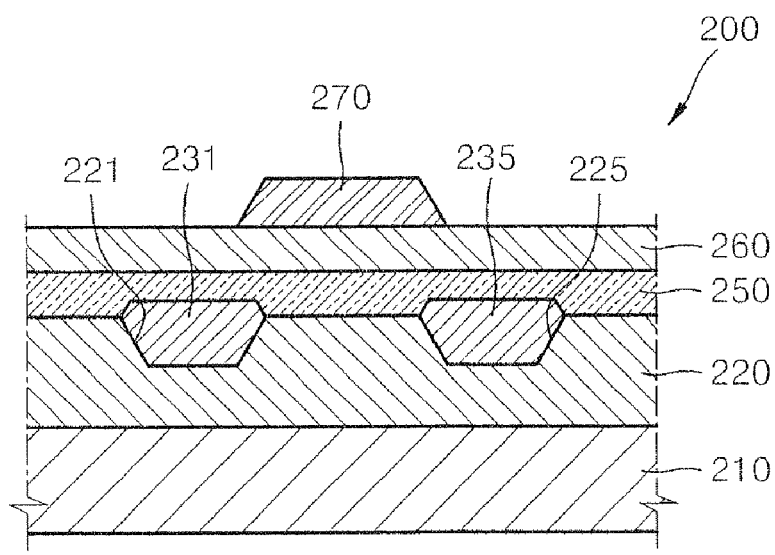
FIG. 2 is a cross-sectional view of an organic TFT according to an embodiment of the present invention.

Turning now to FIG. 2, FIG. 2 is a cross-sectional view of an organic TFT 200 according to an embodiment of the present invention. Referring to FIG. 2, the organic TFT 200 includes an insulating film 220 having concave units 221 and 225 disposed a predetermined distance apart from each other on a substrate 210. The concave units 221 and 225 are groove shaped. Source and drain electrodes 231 and 235 are respectively formed in the grooves 221 and 225. An organic semiconductor layer 250 is formed on the insulating film 220 and on the source and drain electrodes 231 and 235, and a gate insulating film 260 is formed on the organic semiconductor layer 250. A gate electrode 270 is formed on a region of the gate insulating film 260 corresponding to a space between the source and drain electrodes 231 and 235.

The substrate 210 can be a plastic substrate, a glass substrate or a metal substrate. The metal substrate may be formed of a metal such as steel use stainless (SUS). The plastic substrate can be a plastic film made of one of polyethersulphone (PES), polyacrylate (PAR), polyetherimide (PEI), polyethyelene napthalate (PEN), polyethyeleneterepthalate (PET), polyphenylene sulfide (PPS), polyallylate, polyimide, polycarbonate (PC), cellulose triacetate (TAC), cellulose acetate propionate (CAP), etc.

The insulating film 220 is a buffer layer, and can be either a single layer or multilayer of inorganic insulating films. The inorganic insulating films in the insulating film 220 can be an oxide film or a nitride film. In the present embodiment, the concave units 221 and 225 are formed in the insulating film 220 and the source and drain electrodes 231 and 235 are formed in the concave units 221 and 225, but the present invention is not limited thereto. That is, open-type grooves (not shown) that expose portions of the substrate 210 can be formed in the insulating film 220, and the source and drain electrodes 231 and 235 can be formed in the open-type grooves.

When the substrate 210 is a glass substrate or a plastic substrate, the thickness of the insulating film 220 is equal to or greater than the thicknesses of the source and drain electrodes 231 and 235, since the insulating film 220 is used as a buffer film. The grooves 221 and 225 may have appropriate depths in consideration of the thicknesses of the source and drain electrodes 231 and 235. When the substrate 210 is a metal substrate, the insulating film 220 serves not only as the buffer film, but also as an insulating film to insulate the substrate 210 from the source and drain electrodes 231 and 235. Therefore, the insulating film 220 may have an appropriate thickness in consideration of not only the thicknesses of the source and drain electrodes 231 and 235, but also the insulation of the substrate 210 from the source and drain electrodes 231 and 235. Also, the grooves 221 and 225 may have appropriate depths in consideration of the thicknesses of the source and drain electrodes 231 and 235 and the insulation between the substrate 210 and the source and drain electrodes 231 and 235.

The organic semiconductor layer 250 includes at least an organic film made out of at least one of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, polythiophene and its derivatives, polyparaphenylenevinylene and its derivatives, polyparaphenylene and its derivatives, polyfluorene and its derivatives, polythiophenevinylene and its derivatives, polythiophene-heterocyclic aromatic polymeric and its derivatives, oligoacene of naphthalene and its derivatives, alpha-5-thiophene oligothiophene and its derivatives, phthalocyanine that does not include a metal and its derivatives, pyromellitic dianhydride and its derivatives, pyromellitic diimide and its derivatives, perylenetetracarboxylic acid dianhydride and its derivatives, and perylenetetracarboxylic diimide and its derivatives, naphthalene tetracarboxylic diimide and its derivatives, and naphthalene tetracarboxylic acid dianhydride and its derivatives.

In the organic TFT 200, a step difference between the substrate 210 and the source and drain electrodes 231 and 235 can be eliminated, and the organic semiconductor layer 250 without pattern failure can be formed regardless of the thickness of the source and drain electrodes 231 and 235 since the source and drain electrodes 231 and 235 are formed in the grooves 221 and 225. In FIG. 2, the organic semiconductor layer 250 is formed over the entire surface of the insulating film 220, but the organic semiconductor layer 250 can instead be patterned to separate adjacent TFTs.

Figure 3A:
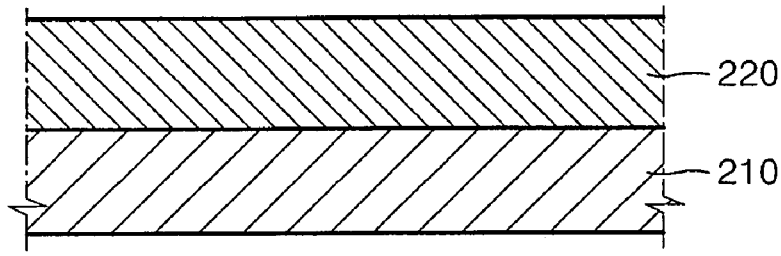
FIGS. 3A through 3F are cross-sectional views illustrating a method of manufacturing an organic TFT according to an embodiment of the present invention.
Figure 3B:
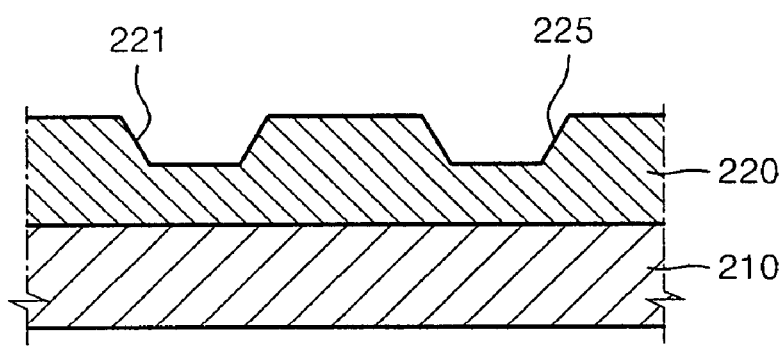

Turning now to FIGS. 3A through 3F, FIGS. 3A through 3F are cross-sectional views illustrating a method of manufacturing an organic TFT according to an embodiment of the present invention. Referring to FIG. 3A, an insulating film 220 as a buffer layer is formed on a substrate 210. The substrate 210 can be a plastic substrate, a glass substrate, or a metal substrate. The buffer layer 220 includes at least one layer of an inorganic insulating film. Referring to FIG. 3B, grooves 221 and 225 in which source and drain electrodes 231 and 235 are to be formed, are formed in the insulating film 220. The grooves 221 and 225 are disposed a predetermined distance apart from each other, and can be formed by etching the insulating film 220 using a typical photolithography method. The depths of the grooves 221 and 225 can be determined according to the thicknesses of the source and drain electrodes 231 and 235, which will be formed in a subsequent process.

Figure 3C:
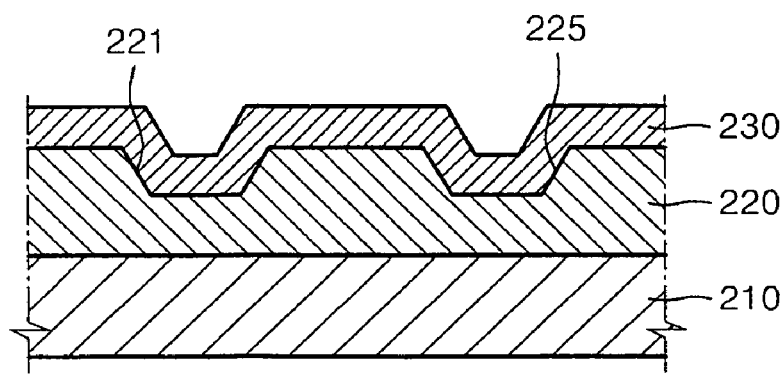
Figure 3D:
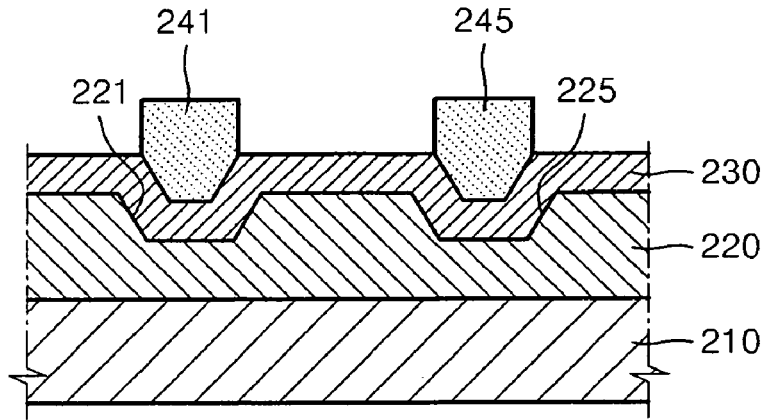

Referring to FIG. 3C, an electrode layer 230 for forming the source and drain electrodes 231 and 235 is deposited on the insulating film 220 using a sputtering process. Alternately, the electrode layer 230 can instead be deposited using other processes, such as a coating process. Referring to FIG. 3D, mask patterns 241 and 245, for example, photosensitive patterns, are formed on the electrode layer 230. The mask patterns 241 and 245 are formed above the grooves 221 and 225, and serve as masks for forming the source and drain electrodes 231 and 235.

Figure 3E:
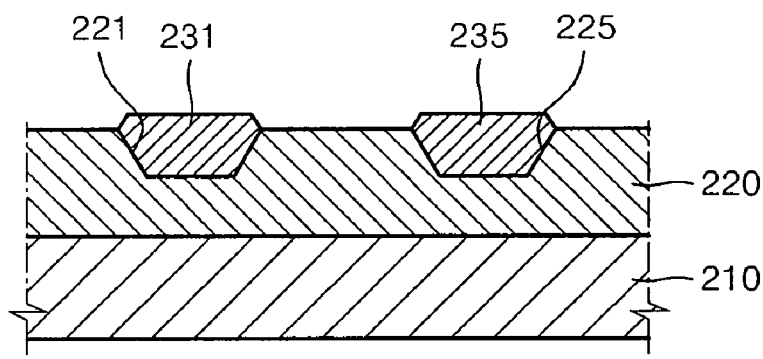

Referring to FIG. 3E, the source and drain electrodes 231 and 235 are formed by patterning the electrode layer 230 using the mask patterns 241 and 245 as masks. That is, the source and drain electrodes 231 and 235 are formed in the grooves 221 and 225 of the insulating film 220. With this arrangement, step differences between the substrate 210 and the source and drain electrodes 231 and 235, that is, between the source and drain electrodes 231 and 235 and the insulating film 220, are prevented or mitigated.

Figure 3F:
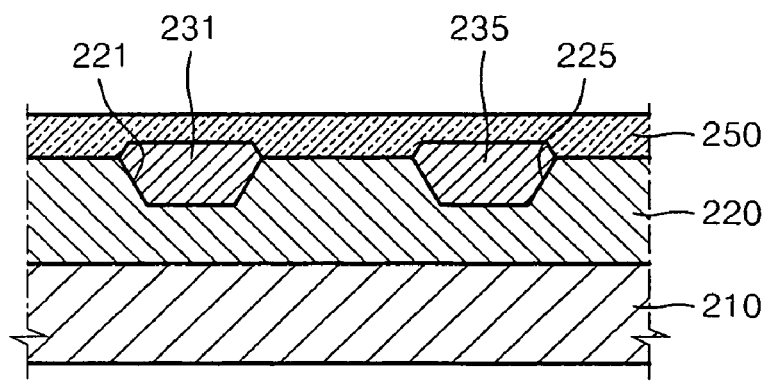

Referring to FIG. 3F, a semiconductor layer 250 is formed on the source and drain electrodes 231 and 235 and on the insulating film 220. The semiconductor layer 250 includes an organic semiconductor material. The manufacturing of the organic TFT 200 as depicted in FIG. 2 is completed when a gate insulating film 260 and a gate 270 are formed on the semiconductor layer 250.

In a top gate type TFT according to an embodiment of the present invention, the step difference between a substrate and source and drain electrodes is prevented by forming the source and drain electrodes in grooves in an insulating film, i.e., a buffer film. In a bottom gate type TFT, the step difference between the substrate and the source and drain electrodes can be removed by forming the source and drain electrodes in grooves formed in a gate insulating film.

Figure 4:
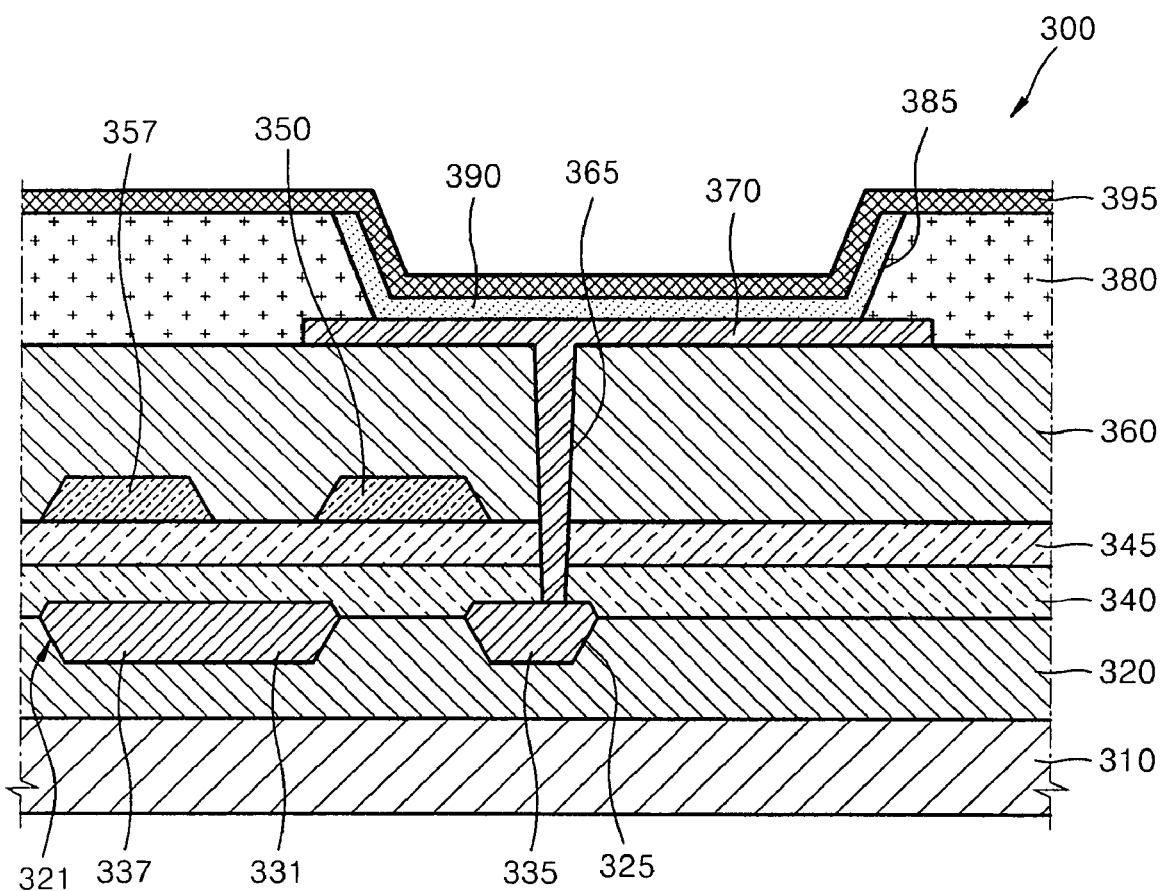
FIG. 4 is a cross-sectional view of an organic electroluminescent display device according to an embodiment of the present invention.

Referring now to FIG. 4, FIG. 4 is a cross-sectional view of an organic electroluminescent (EL) display device 300 according to an embodiment of the present invention. Specifically, FIG. 4 is a cross-sectional view of one of a plurality of pixels that make up the organic electroluminescent display device 300 that includes a driving TFT for driving the organic EL device, and a capacitor.

Referring to FIG. 4, the organic EL display device 300 includes an insulating film 320 having grooves 321 and 325 disposed therein a predetermined distance apart from each other on a substrate 310. The substrate 310 can be a glass substrate, a plastic substrate, or a metal substrate. The insulating film 320 is a buffer layer, and is formed by depositing at least one layer of an inorganic insulating film, such as a nitride film or an oxide film, via a sputtering process. The grooves 321 and 325 are formed by etching the insulating film 320 using a typical photolithography process.

A source electrode 331 and a lower electrode 337 of the capacitor extending from the source electrode 331 are formed in the groove 321 of insulating film 320. A drain electrode 335 is formed in groove 325. After depositing the electrode material on the insulating film 320, the source and drain electrodes 331 and 335 and the lower electrode 337 of the capacitor are formed by etching the electrode material using a typical photolithography process so that the electrode material remains only in the grooves 321 and 325.

A semiconductor layer 340 is formed on the source and drain electrodes 331 and 335, the lower electrode 337 of the capacitor, and on the insulating film 320, and a gate insulating film 345 is formed on the semiconductor layer 340. A gate electrode 350 is formed on a portion of the gate insulating film 345 corresponding to a region of the insulating film 320 between the source and drain electrodes 331 and 335. An upper electrode 357 of a capacitor is formed on a portion of the gate insulating film 345 corresponding to the lower electrode 337 of the capacitor. A protection film 360 is formed on the gate electrode 350, the upper electrode 357 of the capacitor, and the gate insulating film 345. A lower electrode 370 is connected to one of the source and drain electrodes 331 and 335, (connected to the drain electrode 335 in FIG. 4) through a via hole 365 formed in the protection film 360. The lower electrode 370 serves as an anode electrode.

A pixel isolation film 380 having an opening 385 that exposes a portion of the lower electrode 370 is formed. After forming an organic film layer 390 in the opening 385 of the pixel isolation film 380, an upper electrode 395 is formed over the entire resultant structure. The organic film layer 390 includes an organic film such as a hole injection layer, a hole transport layer, a light emitting layer, an electron transport layer, an electron injection layer, and a hole inhibiting layer.

The cross-sectional structures of an organic TFT and an organic EL display device according to the present invention are not limited to the cross-sectional structures depicted in FIGS. 2 and 4, but can be any structure in which grooves are formed in a buffer layer on a substrate and source and drain electrodes are formed in the grooves, and can be applied to all flat panel display devices such as liquid crystal display devices that use a TFT as a switching device. In the embodiments of the present invention described above, the grooves are formed by etching the insulating film using a typical photolithography process, but the present invention is not limited thereto as the grooves can instead be formed by etching the insulating film using other etching methods.

According to the present invention, after forming grooves in an insulating film, source and drain electrodes are formed in the grooves. By doing so, the step difference between a substrate and the source and drain electrodes can be prevented, thus preventing the disconnection of a channel region of the semiconductor layer. Also, an electrostatic discharge (ESD) at edge portions of the source and drain electrodes can be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor, comprising:
   a substrate;
   a buffer film arranged directly on the substrate and including a plurality of concave units, each of the plurality of concave units being separated from each other by a distance, the concave units being spaced-apart from the substrate, wherein the buffer film comprises one or more layers, each of said one or more layers being either a silicon oxide film or silicon nitride film;
   source and drain electrodes arranged within the plurality of concave units in the buffer film, the source and drain electrodes being spaced-apart from the substrate, a depth of the concave units being determined according to a thickness of the source and drain electrodes;
   a semiconductor layer arranged on the entire substrate to cover the source and drain electrodes and the buffer film;
   a gate insulating film arranged on the semiconductor layer; and
   a gate electrode arranged on the gate insulating film.

2. The thin film transistor of claim 1, wherein the substrate is selected from the group consisting of a glass substrate, a plastic substrate, and a metal substrate.

3. The thin film transistor of claim 1, wherein the semiconductor layer comprises an organic semiconductor material.

4. The thin film transistor of claim 1, the source and drain electrodes being comprised of a metal.

5. An organic electroluminescent display device, comprising:
   a substrate;
   a buffer film arranged directly on the substrate and including a plurality of concave units, each of said plurality of concave units being separated from each other by a distance, the concave units being spaced-apart from the substrate;
   a thin film transistor arranged on the buffer film, the thin film transistor including:
      source and drain electrodes arranged in the plurality of concave units in the buffer film, the source and drain electrodes being spaced-apart from the substrate, a depth of the concave units being determined according to a thickness of the source and drain electrodes;
      a semiconductor layer arranged on the entire substrate to cover the source and drain electrodes and the buffer film;
      a gate electrode; and
      an insulating film arranged between the semiconductor layer and the gate electrode;
   an organic electroluminescent device arranged on the thin film transistor, the organic electroluminescent device including:
      a lower electrode connected to one of the source and the drain electrodes;
      an organic film layer arranged on the lower electrode; and
      an upper electrode arranged on the organic film layer; and
   a capacitor, including:
      a lower electrode that extends from one of the source and drain electrodes and is arranged in one of the concave units of the buffer film; and
      an upper electrode.

6. The organic electroluminescent display device of claim 5, wherein the buffer film comprises an inorganic insulating film.

7. The organic electroluminescent display device of claim 5, wherein the buffer film comprises one or more layers, each layer of the one or more layers being one of a silicon oxide film and a silicon nitride film.

8. The organic electroluminescent display device of claim 5, wherein the substrate is selected from the group consisting of a glass substrate, a plastic substrate, and a metal substrate.

9. The organic electroluminescent display device of claim 5, wherein the semiconductor layer comprises an organic semiconductor material.

10. The organic electroluminescent display device of claim 5, the source and drain electrodes being metal wires.

11. A method of manufacturing a thin film transistor, comprising:
    forming a buffer film directly on an upper surface of a substrate;
    forming a plurality of concave units in the buffer film by etching the buffer film, each of the plurality of concave units being separated from each other by a distance, the concave units being spaced-apart from the substrate;
    forming an electrode layer on the buffer film;
    forming source and drain electrodes within the plurality of concave units by etching the electrode layer using a photolithography process, the source and drain electrodes being spaced-apart from the substrate;
    forming a semiconductor layer entirely covering the upper surface of the substrate to cover the source and drain electrodes and the buffer film;
    forming a gate insulating film on the semiconductor layer; and
    forming a gate electrode on the gate insulating film, wherein a depth of the concave units is determined according to a thickness of the source and drain electrodes.

12. The method of claim 11, wherein the substrate is selected from the group consisting of a glass substrate, a plastic substrate, and a metal substrate.

13. The method of claim 11, wherein the buffer film comprises an insulating film.

14. The method of claim 11, wherein the gate insulating film comprises one or more layers, each layer of said one or more layers being either a silicon oxide film or a silicon nitride film.

15. The method of claim 11, wherein the semiconductor layer comprises an organic semiconductor material.

16. The method of claim 11, the source and drain electrodes being metal wires.

17. The method of claim 16, wherein the forming of the electrode layer being by a sputtering process.

* * * * *